United States Patent
Sween et al.

(12) 
(10) Patent No.: US 8,915,558 B2
(45) Date of Patent: *Dec. 23, 2014

(54) LAPTOP COMPUTER SUPPORT

(75) Inventors: Barry P. Sween, Santa Monica, CA (US); Richard James Elgie, Irvine, CA (US)

(73) Assignee: Belkin International, Inc., Playa Vista, CA (US)

( * ) Notice: Subject to any disclaimer, the term of this patent is extended or adjusted under 35 U.S.C. 154(b) by 173 days.

This patent is subject to a terminal disclaimer.

(21) Appl. No.: 13/230,446

(22) Filed: Sep. 12, 2011

(65) Prior Publication Data

US 2012/0000398 A1 Jan. 5, 2012

Related U.S. Application Data

(63) Continuation of application No. 12/874,989, filed on Sep. 2, 2010, now Pat. No. 8,035,971, which is a (Continued)

(51) Int. Cl.
*H05K 7/20* (2006.01)
*F16M 11/00* (2006.01)
(Continued)

(52) U.S. Cl.
CPC ............... *G06F 1/203* (2013.01); *A47B 21/04* (2013.01); *G06F 1/20* (2013.01);
(Continued)

(58) Field of Classification Search
CPC ............ A45C 2013/025; A47B 21/04; A47B 2097/006; A47B 2023/049; A47G 29/00; G06F 1/16; G06F 1/20; G06F 1/203; H05K 7/20; H05K 7/20009; H05K 7/20136; H05K 7/20172
USPC ............. 361/679.41–679.44, 695; 248/176.1, 248/346.01, 346.03; 312/223.1–223.3
See application file for complete search history.

(56) References Cited

U.S. PATENT DOCUMENTS 2,848,149 A 8/1958 Ward
D283,323 S 4/1986 Cervero
(Continued)

FOREIGN PATENT DOCUMENTS

TW M584372 11/2004
TW M272361 8/2005
(Continued)

OTHER PUBLICATIONS

"Belkin F8N044-BRN CushTop Notebook Stand (Chocolate/Blue)", printed from http://www.amazon.com/Belkin-F8N044-BRN-CushTop-Notebook-Chocolate/dp/B000PIR9QM on Feb. 16, 2011 7pages.

(Continued)

*Primary Examiner* — Anthony Haughton
*Assistant Examiner* — Zhengfu Feng
(74) *Attorney, Agent, or Firm* — Allan W. Watts; Bryan Cave LLP

(57) ABSTRACT

Articles for supporting computers on users' laps and for isolating the users from heat from the computers. Embodiments may include a body, a top surface for contacting the computer, a bottom surface for contacting the user's lap, and back and front walls or surfaces. In various embodiments, the body defines a hollow area and a side opening, the back is taller than the front, the top surface is at an acute angle to the bottom surface, the bottom surface has a greater horizontal dimension from front to back than the top surface, the bottom surface has a greater horizontal dimension from left to right than the top surface; the article has a cross section that is a trapezoid (e.g., isosceles), the article comprises a foam portion (e.g., tubular) and fabric covering the foam portion, or a combination thereof. In some embodiments, each surface comprises the foam covered with fabric.

18 Claims, 5 Drawing Sheets

Related U.S. Application Data continuation of application No. 12/184,788, filed on Aug. 1, 2008, now Pat. No. 7,830,661, which is a continuation-in-part of application No. 29/289,811, filed on Aug. 1, 2007, now Pat. No. Des. 578,130.

(60) Provisional application No. 60/963,031, filed on Aug. 1, 2007.

(51) Int. Cl.
| | |
|---|---|
| *A47B 91/00* | (2006.01) |
| *A47G 29/00* | (2006.01) |
| *B65D 19/00* | (2006.01) |
| *A47B 81/00* | (2006.01) |
| *A47B 97/00* | (2006.01) |
| *G06F 1/20* | (2006.01) |
| *A47B 21/04* | (2006.01) |
| *A45C 13/02* | (2006.01) |
| *G06F 1/16* | (2006.01) |
| *A47B 23/04* | (2006.01) |

(52) U.S. Cl.
CPC ........... *A45C 2013/025* (2013.01); *A47G 29/00* (2013.01); *G06F 1/16* (2013.01); *H05K 7/20* (2013.01); *H05K 7/20009* (2013.01); *H05K 7/20136* (2013.01); *H05K 7/20172* (2013.01); *A47B 2097/006* (2013.01); *A47B 2023/049* (2013.01)
USPC ............ 312/223.3; 361/695; 248/176.1; 248/346.01; 248/346.03; 312/223.1; 312/223.2

(56) References Cited

U.S. PATENT DOCUMENTS

| | | | |
|---|---|---|---|
| D296,852 S | 7/1988 | Buchweitz et al. | |
| D312,359 S | 11/1990 | Bradley | |
| 4,991,817 A | 2/1991 | VonKleist et al. | |
| D328,985 S | 9/1992 | Sheldon | |
| 5,143,341 A | 9/1992 | Juster | |
| 5,217,119 A | 6/1993 | Hollingsworth | |
| D351,748 S | 10/1994 | Stein et al. | |
| 5,393,030 A | 2/1995 | Tarozzi | |
| D368,706 S * | 4/1996 | Mieki | D14/451 |
| 5,542,640 A | 8/1996 | Tarozzi | |
| D376,787 S | 12/1996 | Calfee | |
| 5,685,441 A | 11/1997 | Calfee | |
| 5,725,189 A * | 3/1998 | Landy | 248/205.2 |
| D399,834 S | 10/1998 | Calfee | |
| 5,871,094 A | 2/1999 | Leibowitz | |
| 5,966,286 A | 10/1999 | O'Connor et al. | |
| 6,094,347 A | 7/2000 | Bhatia | |
| 6,170,222 B1 | 1/2001 | Miller | |
| 6,239,971 B1 | 5/2001 | Yu | |
| 6,267,236 B1 | 7/2001 | Seok | |
| D448,950 S | 10/2001 | McIveen | |
| 6,305,652 B1 * | 10/2001 | Borke et al. | 248/174 |
| 6,353,536 B1 | 3/2002 | Nakamura et al. | |
| 6,466,438 B1 | 10/2002 | Lim | |
| 6,527,241 B1 | 3/2003 | Lord | |
| 6,604,618 B1 * | 8/2003 | Godshaw et al. | 190/107 |
| 6,604,783 B2 | 8/2003 | Goodson | |
| 6,687,123 B2 | 2/2004 | Kitahara | |
| 6,707,668 B2 | 3/2004 | Huang | |
| 6,754,072 B2 | 6/2004 | Becker et al. | |
| 6,781,833 B2 | 8/2004 | Lu | |
| 6,822,856 B2 | 11/2004 | Fujiwara | |
| 6,894,894 B2 | 5/2005 | Lin | |
| 6,894,896 B2 | 5/2005 | Lin | |
| D511,522 S | 11/2005 | Toltzman et al. | |
| 7,019,968 B2 | 3/2006 | Kitahara | |
| 7,035,100 B2 | 4/2006 | Lord | |
| D522,002 S | 5/2006 | Cheng | |
| 7,038,909 B1 | 5/2006 | Chen | |
| 7,106,585 B2 | 9/2006 | Lin | |
| 7,121,214 B1 | 10/2006 | Toltzman et al. | |
| 7,161,799 B2 | 1/2007 | Lim et al. | |
| 7,207,540 B2 | 4/2007 | Thomas | |
| D543,209 S | 5/2007 | Bae | |
| 7,261,270 B2 | 8/2007 | Chen et al. | |
| D554,135 S | 10/2007 | Lim et al. | |
| D555,655 S | 11/2007 | Iu | |
| 7,301,765 B2 | 11/2007 | Huang | |
| 7,322,063 B2 | 1/2008 | Esimai | |
| 7,359,184 B2 | 4/2008 | Lord | |
| D573,150 S | 7/2008 | Sween | |
| D573,597 S | 7/2008 | Shieh | |
| D574,375 S | 8/2008 | Prest et al. | |
| D578,130 S | 10/2008 | Sween et al. | |
| 7,453,694 B2 | 11/2008 | Lee | |
| D593,567 S | 6/2009 | Benson et al. | |
| 7,545,634 B2 | 6/2009 | Simonian et al. | |
| 7,663,876 B2 | 2/2010 | Lin | |
| D619,139 S | 7/2010 | Ho | |
| D621,406 S | 8/2010 | Hoehn et al. | |
| D623,188 S | 9/2010 | Son et al. | |
| 7,800,903 B2 | 9/2010 | Wang | |
| 7,830,661 B2 | 11/2010 | Sween et al. | |
| 7,860,661 B2 | 12/2010 | Wang et al. | |
| 7,881,053 B1 | 2/2011 | Huang | |
| 7,980,526 B2 | 7/2011 | Lord et al. | |
| 7,983,027 B2 | 7/2011 | Lord | |
| 8,000,099 B2 | 8/2011 | Parker | |
| 8,035,971 B2 * | 10/2011 | Sween et al. | 361/695 |
| 2004/0188289 A1 | 9/2004 | Woo | |
| 2004/0256535 A1 | 12/2004 | Desch | |
| 2005/0083650 A1 | 4/2005 | Yang | |
| 2006/0262497 A1 | 11/2006 | Jahlokov | |
| 2007/0215779 A1 | 9/2007 | Traun | |
| 2007/0258206 A1 | 11/2007 | Huang | |
| 2008/0007910 A1 | 1/2008 | Lin | |
| 2008/0037213 A1 | 2/2008 | Haren | |
| 2008/0061207 A1 | 3/2008 | Panziera et al. | |
| 2008/0142663 A1 | 6/2008 | Wright et al. | |
| 2008/0173507 A1 | 7/2008 | Janssen | |
| 2009/0032667 A1 | 2/2009 | Sween et al. | |
| 2009/0179131 A1 | 7/2009 | Lord et al. | |
| 2009/0212180 A1 | 8/2009 | Lord | |
| 2010/0270188 A1 | 10/2010 | Dotson | |

FOREIGN PATENT DOCUMENTS

| | | |
|---|---|---|
| TW | M295281 | 1/2006 |
| TW | M299452 | 10/2006 |
| TW | M307784 | 3/2007 |
| TW | M1283153 | 6/2007 |
| WO | WO0059339 | 10/2000 |
| WO | WO2004104803 | 12/2004 |
| WO | WO2009002563 | 12/2008 |
| WO | WO2009018545 | 2/2009 |
| WO | WO2009091569 | 7/2009 |

OTHER PUBLICATIONS

Chill Mat, Targus Group International, 2 pages, 2007.
European Search Report for Application No. 10196563.0-1245 / 2299348, 6 pages, May 31, 2011.
European Search Report for Application No. 08797063.8 1245 / 2179635 PCT/US2008072014, 6 pages, Jun. 1, 2011.
International Search Report, Application No. PCT/US08/72000, 10 pages, Sep. 30, 2008.
International Search Report, Application No. PCT/US08/72014, 9 pages, Oct. 22, 2008.
Belkin: CushTop, http://www.belkin.com/laptopathome/cushtop/, 1 page, Jun. 15, 2007.
Vaio, VGP-VST1, http://www.ecat.sony.co.jp/vaio/acc/acc.cfm?PD=26608, 3 pages, May 31, 2007.
Belkin: CushTop Hideaway, http://catalog.belkin.com/IWCatProductPage.process?Product_Id=459905, 1page, Jul. 31, 2008.

(56) References Cited

OTHER PUBLICATIONS

Review: Belkin Cushtop Laptop Stand, http://www.philoking.com/2007/09/30/review-belkin-cushtop-laptop-stand/, 5 pages, Sep. 30, 2007.
Logitech Speaker Lapdesk N700, http://www.logitech.com/en-us/notebook-products/cooling-pads/devices/6564, 4 pages, printed Oct. 12, 2010.
Targus Lap Chill Mat, http://www.logitech.com/us/product_details.aspx?sku=AWE55US, 4 pages, printed Oct. 12, 2010.
Office Max New Item/Maintenance Forms for Notebook Cushtop Case.
English Translation of TIPO Search Report Dec. 6, 2013.

\* cited by examiner

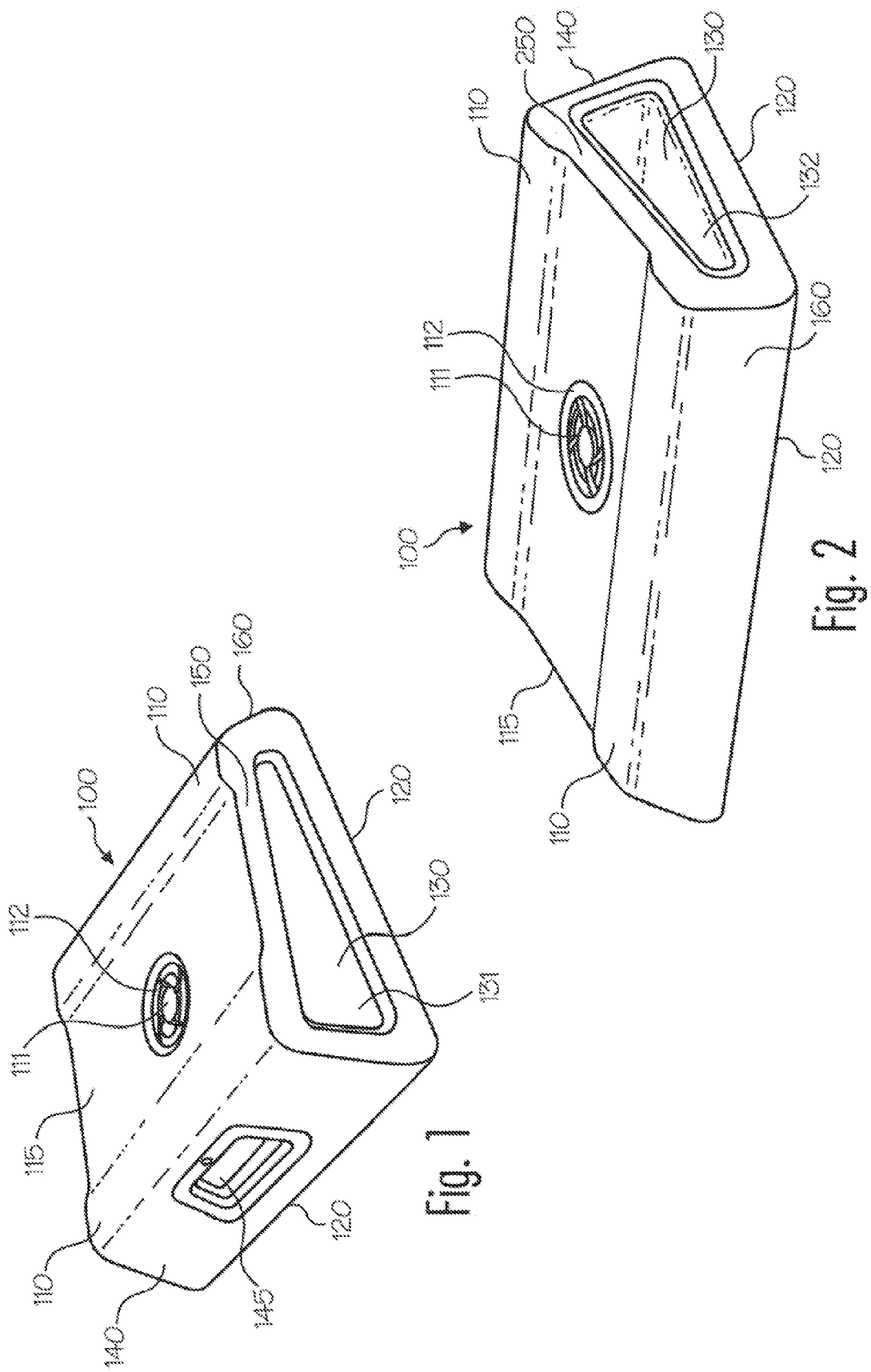

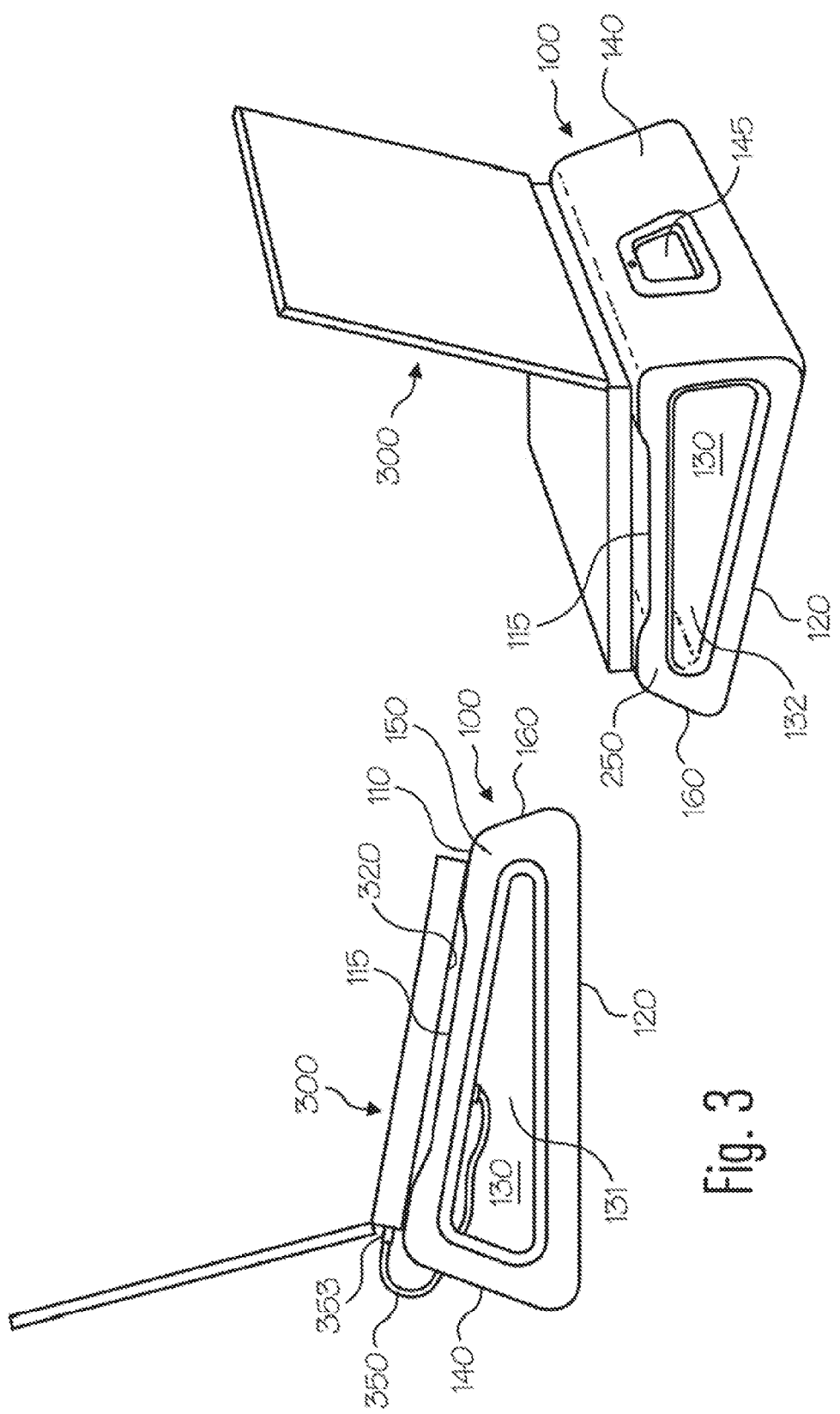

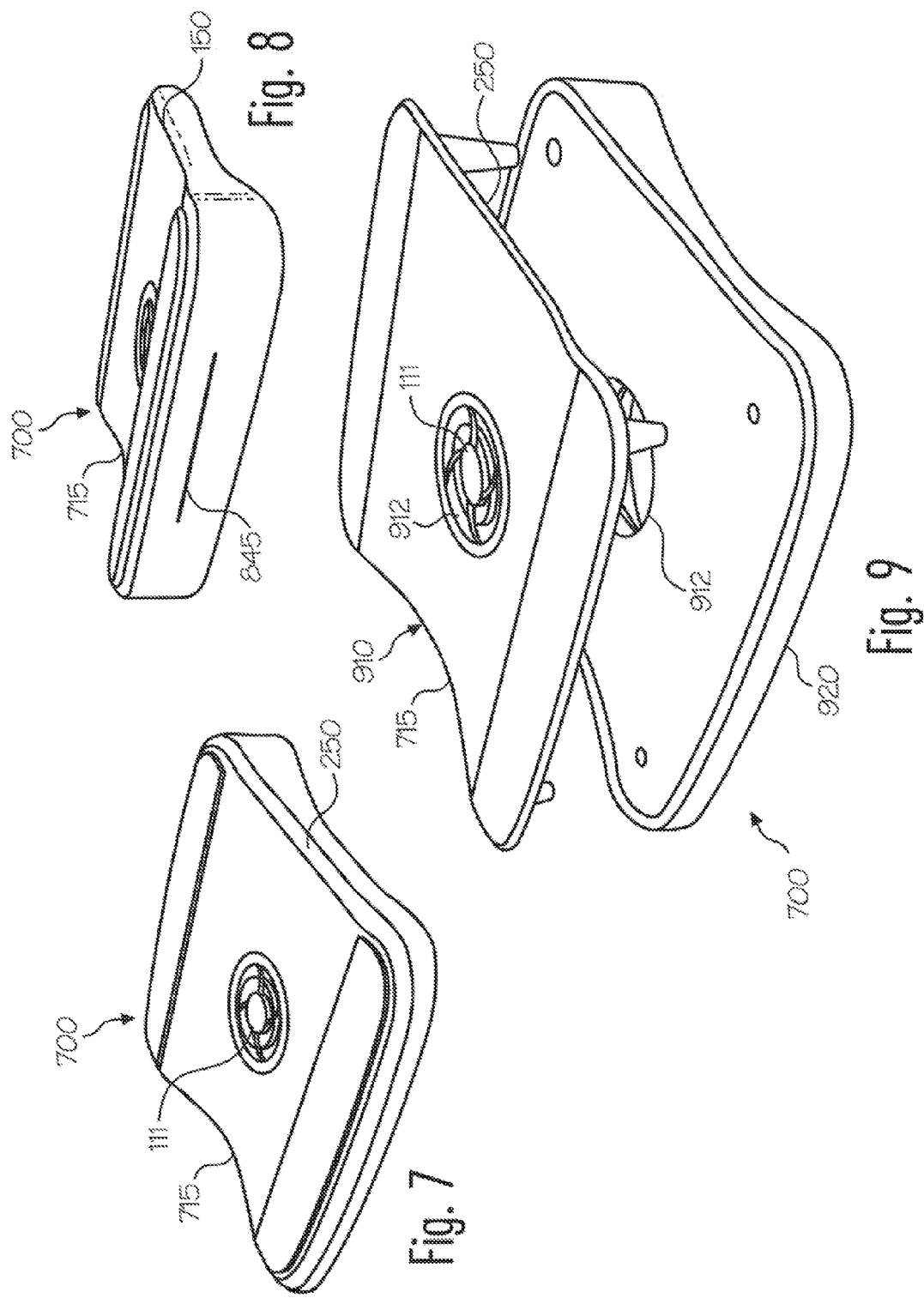

LAPTOP COMPUTER SUPPORT

RELATED APPLICATIONS

This patent application is a continuation of, and claims priority to, U.S. patent application Ser. No. 12/874,989, filed on Sep. 2, 2010, which claims priority to U.S. patent application Ser. No. 12/184,788 filed on Aug. 1, 2008, which issued as U.S. Pat. No. 7,830,661 on Nov. 9, 2010, which claims priority to U.S. provisional patent application 60/963,031 filed on Aug. 1, 2007, and to U.S. design patent application No. 29/289,811, also filed on Aug. 1, 2007, which issued as U.S. Pat. No. D578,130 on Oct. 7, 2008, all having the same title, inventors, and assignee. All of these patent applications are incorporated by reference herein in their entirety.

FIELD OF THE INVENTION

This Invention relates to devices for supporting computers while the computers are in use.

BACKGROUND OF THE INVENTION

In the past, laptop computers have been placed directly on user's laps when in use, as well as on desks, tables, and the like. The ability to use a laptop computer directly on one's lap has allowed users to use laptop computers in locations where computer use would otherwise not be possible, or as convenient, such as in vehicles, such as cars, busses, trains, subways, air planes, boats, and the like. Users have also used laptop computers in locations where computers were not traditionally used, such as in living rooms, on sofas, in recliners, in arm chairs, on the porch, on a deck, on a balcony, by the pool, in yard furniture, etc.

Use of laptop computers in such locations has allowed computer users to interact with other people in a more social atmosphere, while using the computer, and use of laptop computers in such situations has expanded their scope of use. For example, a computer user can use a laptop while watching television to research (e.g., through the Internet via a wireless connection) subjects being discussed on the television program, can read e-mails during commercials, can show images on the computer to others in the room, etc.

Laptop computers, however, generate heat while in use, at least a portion of which has traditionally been dissipated through the bottom of the computer. Such heat has commonly been transferred to the user's lap or legs. Such heat may be welcome in a cool environment, but in warmer environments is unwelcome or uncomfortable. In some situations, users have had to turn down thermostats on air conditioning units to provide for an environment in which having a warm laptop computer on one's lap is not uncomfortable. Such thermostat adjustments have resulted in greater electrical energy consumption.

In addition, the bottoms of laptop computers have traditionally been hard, and are not necessarily contoured to fit the shape of a user's lap or legs. Thus, having a laptop computer directly on a user's lap may be uncomfortable for these reasons as well. Furthermore, for many users, having a laptop computer directly on their lap may result in the keyboard, screen, or both, being too low ergonomically. A user may need to reach lower than desired to use the keyboard such a computer, or may need to bend their head downward more than desirable, putting a strain on their neck or back, as examples.

Thus, needs and potential for benefit exist for systems and devices that support laptop computers above a user's lap or legs, that insulate a user from the heat from (e.g., the bottom of) a laptop computer, or a combination thereof, as examples. Needs and potential for improvement exist for such systems and devices that are relatively inexpensive to manufacture, that are easy to use, and that are durable, safe to use, aesthetically appealing, and versatile. Room for improvement exists over prior art in these and other areas that may be apparent to a person of ordinary skill in the art having studied this document.

SUMMARY OF PARTICULAR EMBODIMENTS OF THE INVENTION

This invention provides, among other things, various articles for supporting laptop computers that a user can use on their lap between their laptop computer and their body, and various methods concerning such articles, including methods of manufacture. Particular embodiments provide, as objects or benefits, for example, that they support laptop computers above a user's lap or legs, that they insulate a user from the heat from (e.g., the bottom of) a laptop computer, or both. A number of embodiments provide such systems and devices that are relatively inexpensive to manufacture, that are easy to use, and that are durable, safe to use, aesthetically appealing, and versatile. Other benefits to certain embodiments may be apparent to a person of ordinary skill in the art.

In a variety of specific embodiments, this invention provides, among other things, various articles for supporting a computer on a user's lap and for isolating the user from heat from the computer. In specific embodiments, such an article may include, for example, a body that may include, for instance, a top surface for contacting the computer, a bottom surface for contacting the user's lap, a back wall, and a front wall. In a number of embodiments, the back wall may extend, for example, from the bottom surface to the top surface at a back of the article, and the front wall may extend from the bottom surface to the top surface at a front of the article. Further, in a number of embodiments, the back wall of the article may be taller than the front wall of the article. Moreover, in some such embodiments, the body may define a hollow area, for instance, between the top surface and the bottom surface and between the back wall and the front wall. Additionally, in various embodiments, the body may further include at least one side opening to the hollow area. Furthermore, in some embodiments, the body may include a foam portion and fabric covering the foam portion.

In particular such embodiments, the (e.g., at least one) side opening to the hollow area may include a right side opening to the hollow area and a left side opening to the hollow area. In some such embodiments, the left side opening may be opposite to the right side opening, for example. Further, in certain embodiments, the right side opening to the hollow area and a left side opening to the hollow area may include, for instance, coverings, for instance, to facilitate storage within the hollow area. Moreover, in particular embodiments, the article may further include hook and loop fasteners. Still further, in some embodiments, the foam portion may be tubular, the top surface of the article may be at an acute angle to the bottom surface of the article, the body may have a cross section, when viewed from a side, that is a trapezium, or a combination thereof, as examples.

In various embodiments, the front wall and the back wall are not vertical, but rather, lean in toward the center of the article so that the bottom surface has a greater horizontal dimension from front to back than top surface. Further, in some embodiments, the left side and the right side of the article may lean in toward the center so that the bottom surface has a greater horizontal dimension from left to right than the top surface. Even further, in some embodiments, the body has a cross section, when viewed from the front or from the back that is a trapezoid. Further still, in some embodiments, the foam portion may have thickness of about one inch to about 1¼ inch, for example, and in some embodiments, the bottom surface, the top surface, the back wall, and the front wall each may include, for instance, the foam covered with the fabric. Still further, in some embodiments, the article may include, for example, pockets for storage, the hollow area may be a compartment for storage of the computer, or both.

Other specific embodiments of an article may include, for example, a top surface for contacting the computer, a bottom surface for contacting the user's lap, a back surface extending from the bottom surface to the top surface, and a front surface extending from the bottom surface to the top surface. In various such embodiments, the back surface of the article may be taller than the front surface of the article, the top surface of the article may be at an acute angle to the bottom surface of the article, the bottom surface may have a greater horizontal dimension from the front surface to the back surface than the top surface, the bottom surface may have a greater horizontal dimension from left to right than the top surface, or a combination thereof, for example. Further, in a number of embodiments, the article may have a cross section, when viewed from the front or from the back that is a trapezoid, the article may include a foam portion and fabric covering the foam portion, the bottom surface may include the foam covered with the fabric, the top surface may include the foam covered with the fabric, the back surface may include the foam covered with the fabric, the front surface may include the foam covered with the fabric, or a combination thereof, for instance.

In particular embodiments, the foam portion may be tubular and the article may define a hollow area, for example, between the top surface and the bottom surface and between the back surface and the front surface, and in some embodiments, the article may further include at least one side opening to the hollow area. Moreover, in certain embodiments, the (e.g., at least one) side opening to the hollow area may include a right side opening to the hollow area and a left side opening to the hollow area, and the left side opening may be opposite to the right side opening. Further, in particular embodiments, the at least one side opening to the hollow area may include a closable opening to facilitate storage within the hollow area. Furthermore, in some embodiments, the foam portion may have a thickness of one inch to 1¼ inch, the hollow area may be a compartment for storage of the computer, the article may have a cross section, when viewed from a side, that is a trapezium, the article may include pockets in the fabric for storage, the fabric may be stitched, or a combination thereof, for example.

Still other specific embodiments may include, for example, a body having, for instance, a top surface for contacting the computer, a bottom surface for contacting the user's lap, a back extending from the bottom surface to the top surface at a back of the article, and a front extending from the bottom surface to the top surface at a front of the article. In a number of such embodiments, the back of the article may be taller than the front of the article, the top surface of the article may be at an acute angle to the bottom surface of the article, the bottom surface may have a greater horizontal dimension from the front of the article to the back of the article than the top surface, the bottom surface of the article may have a greater horizontal dimension from left to right than the top surface of the article, and the body may have a cross section, when viewed from the front of the article or from the back of the article that is an isosceles trapezoid, for instance.

In particular such embodiments, the body defines a hollow area between the top surface of the article and the bottom surface of the article and between the back of the article and the front of the article, and the body may further include at least one side opening to the hollow area. Moreover, in certain embodiments, the body may include a foam portion, which, in some embodiments, may be tubular. Further, in particular embodiments, the body may include a fabric covering, and in some embodiments, the fabric covers the bottom surface of the article, the top surface of the article, the back of the article, and the front of the article. In addition, various other embodiments of the invention are also described herein.

BRIEF DESCRIPTION OF THE DRAWINGS

FIGS. 1 to 6 illustrate an example of an embodiment of a an article for supporting a computer on a user's lap. Specifically, FIG. 1 is an isometric view showing the back, top, and left side of this embodiment of the article. In addition, FIG. 2 is an isometric view showing the front, top, and right side of this embodiment of the article. Furthermore, FIG. 3 is a left side view showing a laptop computer on this same embodiment of the article or support device, and FIG. 4 is an isometric view showing the back, top, and right side of the article, in this same embodiment, and also showing a laptop computer on the article. Moreover, FIG. 5 is an isometric view showing the back, top, and right side of this same embodiment of the article, without a laptop computer on the article, and FIG. 6 is an exploded isometric view of this embodiment of the article showing the various components of the article.

Furthermore, FIGS. 7 to 9 are isometric views of another embodiment of a computer support device or an article for supporting a computer on a user's lap.

FIG. 7 shows the front, top, and right side of this embodiment, and

FIG. 8 shows the top, back, and left side. In addition,

FIG. 9 shows the front, top, and right side of this same embodiment of the article, in a partially exploded view. Further.

Further still.

DETAILED DESCRIPTION OF EXAMPLES OF EMBODIMENTS

Figure 5:
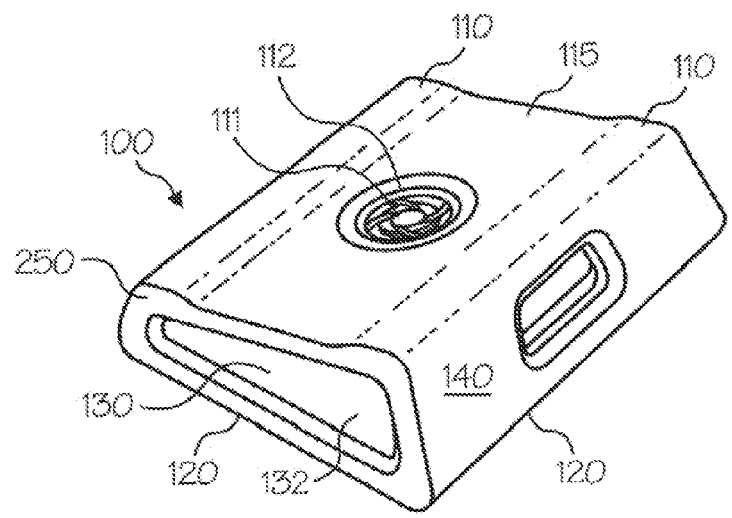

FIGS. 1 to 6 illustrate an example of an article or support 100 for a laptop computer 300 (FIGS. 3 and 4) that a user can use on their lap between their laptop computer (e.g., 300) and their body, for example to raise the computer (e.g., 300), prevent heat transfer from the computer (e.g., 300) to the user, change the angle of the computer (e.g., 300), provide for better cooling of the computer (e.g., 300), or a combination thereof, as examples. In many embodiments, support 100 can also (e.g., alternately) be placed on a desk, table, coffee table, ottoman, foot rest, chair, end table, counter, chaise lounge, automobile hood, ice chest, or the like, rather than on the user's lap, and used to support a computer (e.g., 300) while the computer is being used (e.g., to provide improved ergonomics).

In the embodiment illustrated, support 100, for example, includes top surface 110 that the computer (e.g., 300) sits on, bottom surface 120 that sits on the user's lap or legs (or another surface), and hollow area 130 between top surface 110 and bottom surface 120. In the embodiments depicted, top surface 110 is set at an angle to bottom surface 120 (e.g., as shown in FIG. 3). In many embodiments, top surface 110 is not parallel to bottom surface 120. Further, many embodiments include at least one recess or indentation, such as indentation 115 shown in top surface 110, for example, to allow air to circulate and reach at least part of the bottom 320 of the laptop computer 300. In addition, or instead, some embodiments include at least one aperture, such as aperture 112 (see FIG. 6) through top surface 110, for instance, to allow air to travel from hollow area 130 to bottom 320 of computer 300 (or in the opposite direction, in some embodiments).

Numerous embodiments include a fan, such as fan 111 (e.g., located in or near aperture 112), for example, that moves air to, across, or past bottom 320 of computer 300, for instance. In different embodiments, fan 111 may be an axial, centrifugal, or mixed flow fan, for example, and may be driven (e.g., on a common shaft) by an electric motor (e.g., motor 1013 shown in FIG. 10), which may be an AC or DC motor, for instance. Fan 111 may include fan blades, that may be plastic, for instance. In different embodiments, fan 111 may be a single-speed fan, a two-speed fan, a three-speed fan, a variable-speed fan, or the like (e.g., with a corresponding motor 1013).

In some embodiments, article or support 100 or fan 111 may include a thermostat, which may turn fan 111 (e.g., or motor 1013) on and off, alter the speed or torque of fan 111 (e.g., or motor 1013), or both, for example, in response to the temperature of back 320 of computer 300, the air at fan 111, or a combination thereof, as examples. In other embodiments, fan 111 may operate all of the time when plugged in (e.g., via plug 353 shown in FIGS. 3 and 10), or a switch may be provided (e.g., at fan 111, within cord 350 described below, or within support 100) to turn fan 111 on or off manually. In some embodiments, fan 111 may be powered by or controlled by computer 300, for example, via a USB cable (e.g., 350).

As illustrated, some embodiments include at least one back wall, such as back wall 140 shown in FIGS. 1, 3, 4, 5, and 6 that extends, for example, from bottom 120 to top 110. In the embodiment illustrated, wall 140 includes (e.g., rear) opening 145, which may provide, for example, for the movement of air (e.g., to or from hollow area 130), provide a passageway for one or more cables (e.g., to fan 111), or both. In some embodiments, fan 111 may be located at or in back wall 140 or opening 145, as another example. In such embodiments, support 100 may include ducting from the fan to one or more openings or apertures (e.g., 112), for instance, in top surface 110, or the left and right sides may be covered or closed. In other embodiments, fan 111 may be located at or within bottom 120, within hollow 130, at the right or left side, or in another location, as other examples. Some embodiments may omit wall 140, but may have another structure between top 110 and bottom 120, as another example.

In the embodiment illustrated, article or support 100 also includes front wall 160, which as shown in FIG. 3, for example, may not be as tall as back wall 140. In this embodiment, top surface 110 and bottom surface 120 are not parallel to each other. As used herein, in this context, not parallel means not parallel by at least 10 degrees. In various embodiments, top surface 110 is not horizontal or is at an acute angle to bottom surface 120. In the embodiment illustrated, as shown in FIG. 3, for instance, Front wall 160 and rear wall 140 are not vertical, but rather, lean in toward the center, so that bottom surface 120 has a greater horizontal dimension from front to back than top surface 110, rendering article or support 100 more stable than would otherwise be the case.

Further, in the embodiment illustrated, article or support 100 also includes left side 150 and right side 250, which, in this embodiment, are angled slightly from vertical. As used herein, words that indicate direction, such as vertical, horizontal, above, below, taller, side, front, back, etc., assume that the article is placed on a horizontal surface in its normal orientation when being used to support a computer, such as shown in FIG. 3, for example. In the embodiment illustrated, as shown in FIG. 3, for instance, left side 150 and right side 250 lean in toward the center, so that bottom surface 120 has a greater horizontal dimension from left to right than top surface 110, rendering article or support 100 more stable than would otherwise be the case.

In the embodiment illustrated, indentation 115 in top surface 110 extends from left side 150 to right side 250, as shown. Further, in the embodiment illustrated, there is one indentation 115 and computer 300 is supported at the front and the back by top surface 110. Other embodiments may have multiple indentations, multiple top apertures through the top surface, or both, for example. In embodiments having multiple indentations, the indentations may each extend from the left side to the right side or indentations may connect, as examples. In various embodiments, one or more indentations may extend from front to back (e.g., from front wall 160 to back wall 140), at an angle, or from front to side or back to side, or one or more indentations may not extend to a side, front or back, but may extend past the dimensions of computer 300, as another example.

Figure 6:
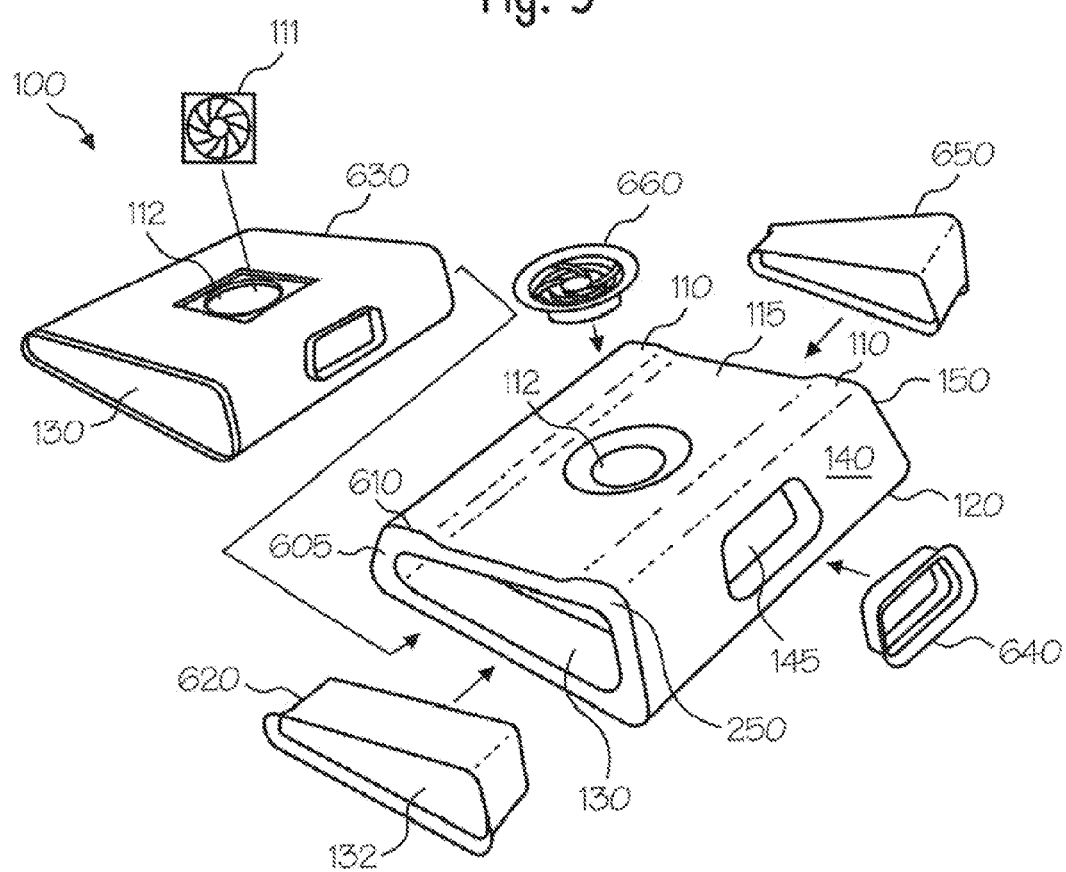

Referring to FIG. 6, in the embodiment illustrated, support 100 includes body 605, which in certain embodiments, is made of foam, and may be covered with fabric 610. Body 605 may be open cell foam, such as foam rubber, or may be closed-cell foam, in different embodiments. Fabric 610 may be polyester, rayon, nylon, cotton, vinyl, leather, halpalon, Kevlar, or the like, or a combination thereof, as examples, and may be coated in some embodiments. Fabric 610 may be stitched or glued, as examples, to itself, to body 605, or to other components. In different embodiments, fabric 610 may be woven or knitted, or may be a single sheet of monolithic material, which in some embodiments, may be fiber reinforced, as examples.

In certain embodiments, hollow area 130 is lined with core or liner 630, which may be made of a more rigid material, such as plastic, and may provide stiffness to support 100. In the embodiment illustrated, support 100 also includes right and left end caps 620 and 650 which attach to or fit concentrically with liner 630 on the right and left sides (e.g., 250 and 150) of support 100 respectively. Also in this embodiment, back cap 640 attaches to or fits within opening 145. Liner 630, end caps 620 and 650, back cap 640, or a combination thereof, may be made of a thermal plastic, a thermal set plastic, polyethylene, high-density polyethylene, nylon, or the like, and may be fiber reinforced in some embodiments. In particular embodiments, end caps 620 and 650, back cap 640, or a combination thereof, may attach to liner 630, for example, via glue, fasteners, staples, pins, snaps, hook and loop fasteners, or an interference or snap fit, or a combination thereof, and in some embodiments, end caps 620 and 650, back cap 640, or a combination thereof, may contain, cover, or attach to the ends of fabric 610, or a combination thereof, for example.

Fan 111 may fit within, adjacent to, or within a passageway to, aperture 112, and may attach to liner 130, body 605, fabric 610, or a combination thereof. Fan grill 660 may cover, attach to, or be part of fan 111, and may fit within or adjacent to aperture 112, may attach to liner 130, body 605, fabric 610, or a combination thereof, for example. In some embodiments, fan 111 is powered through a cord 350 (shown in FIGS. 3 and 10) that extends from fan 111 to, for example, a receptacle or port, such as a USB port in or on computer 300. In some embodiments, cord 350 may be permanently attached to fan 111. In other embodiments, a jack may be provided at or near fan 111 or motor 1013 which cord 350 may plug into. In some such embodiments, cord 350 may be a USB cord or a mini USB cord, and a corresponding jack may be provided at, near, or electrically connected to, fan 111 or motor 1013, for example. In some embodiments, cord 350 may pass through opening 145, for example. In other embodiments, cord 350, or a similar cord, may pass through body 605, between body 605 and liner 630, between body 605 and fabric 610, through a passageway in liner 630, or the like. In other embodiments, fan 110 may be powered by batteries located within support 100, or by a 110 Volt AC power cord, as other examples.

In some embodiments, support 100, body 605, fabric 610, hollow area 130, liner 630, end caps 620 and 650, or a combination thereof, may be tubular, for example, with a cross section that is a quadrilateral, a trapezium (i.e., a quadrilateral with no two parallel sides), a triangle, or the like, which may have rounded corners, and may have substantially square ends. In some embodiments, the ends may lean in at the top, forming a trapezoid (e.g., having a parallel top 110 and bottom 120 from one or more points of view) or an isosceles trapezoid (e.g., having the right and left sides leaning at the same angle) when viewed from the front or back. Computer 300 shown in FIGS. 3 and 4 provides a sense of scale for the embodiment illustrated, and body 605 may be about 1-inch thick, in particular embodiments. In other embodiments, body 605 may be ¼, ½, ¾, 1¼, 1½, or 2 inches thick, as other examples, or a thickness therebetween. Opening 145, back cap 640, or both, may have a cross section that is round, square, rectangular, trapezoidal (e.g., an isosceles trapezoid), or the like, which may have rounded corners, for instance.

The embodiment illustrated includes a single recess or indentation 115 that allows air to circulate past a majority of back 320 of computer 300. In this embodiment, computer 300 is supported at the front and back of the keyboard only. In other embodiments, more than one recess or indentation may be provided, computer 300 may be supported at more or different locations, or the like. Further, in the embodiment illustrated, air from recess 115, from fan 111, is directed out the sides (e.g., the right and left sides) of support 100 (e.g., between top surface 110 and computer 300. In other embodiments, air is directed in other directions, for example, towards the back, up, or at an angle up and towards the back, or a combination thereof. In other embodiments, fan 111 blows air downward which is then directed out opening 145, through end caps 620, 650, or both, or a combination thereof, as examples.

In some embodiments, top surface 110 includes a non-slip material or surface (e.g., where computer 300 contacts top surface 110, for instance, outside of indentation 115) to help prevent computer 300 from moving or sliding off of support 100. In some embodiments, such a non-slip surface covers top surface 110. In other embodiments, the non-slip surface just covers some or all portions of top surface 110 other than recess 115. In some embodiments, all of fabric 610 may include a non-slip surface, as another example. A non-slip surface may include an elastomer or a coating (e.g., printed or applied) on fabric 610, for example, or another layer of fabric material that may be sewn or glued to fabric 610, as examples.

Support 100 (or other embodiments) may include storage areas for various devices or items, including, for example, for computer peripheral devices or the like. For example, in some embodiments, support 100 may include (e.g., within hollow area 130, body 605, liner 630, or a combination thereof), pockets or compartments for storage for computer 300 itself, a mouse, a power supply (e.g., for computer 300), pens, pencils, one or more computer cables or USB cables, one or more disks, CDs, or DVDs, one or more memory sticks, a remote control, a mobile or cordless phone, papers, books, a note pad, food, canned or bottled beverages, eye glasses, cash money, jewelry, credit, debit, or identification cards, tissues, medications, or other personal items, or a combination thereof, for instance. In some embodiments, support 100, or other embodiments, may include handles (e.g., like brief case or luggage handles) to facilitate carrying the support (e.g., when one or more of the objects described herein, or other objects, are stored inside).

In some embodiments, the sides or end caps (e.g., 620, 650, or both), may be closed or may contain doors, closable openings, coverings, or the like, for instance, to facilitate storage within core 130, to direct ventilation air (e.g., from or to fan 111), or both. In some embodiments, fabric 610 may include pockets (e.g., sewn, glued, or plastic welded). Some embodiments may include zippers, hook-and-loop fasteners, ties, elastic closures, locks, alarms, etc.

Support 100 is an example of certain specific embodiments of articles for supporting a computer on a user's lap, for cooling the computer, for isolating the user from heat from the computer, or a combination thereof, as examples. In the embodiment illustrated, support 100 includes body 605 having top surface 110 for contacting computer 300 and bottom surface 120 for contacting the user's lap, for example. In the embodiment of support 100, body 605 defines hollow area 130 between top surface 110 and bottom surface 120. The embodiment of support 100 also includes (one) top aperture 112 extending through top surface 110 to hollow area 130, for example, to allow airflow between hollow area 130 and computer 300. Further, the embodiment of support 100 includes fan 111 positioned and configured to move air through top aperture 112 and past computer 300, and indentation 115 in top surface 110 to allow air to circulate by computer 300. In this particular embodiment, top aperture 112 extends through top surface 110 specifically from indentation 115 to hollow area 130, for example, to allow airflow between hollow area 130 and computer 130.

Further, the embodiment of article or support 100 includes a first side opening in the article (e.g., through end cap 650 in left side 150), for example, to allow air to circulate through hollow area 130 and through top aperture 112 past computer 300. In addition, the embodiment of support 100 further includes a second side opening in the article, (e.g., through end cap 620 in right side 250), which, as used herein, is opposite to the first side opening (e.g., through end cap 650 in left side 150), for example, to allow air to further circulate through hollow area 130. As mentioned, support 100 also includes, in the embodiment illustrated, back wall 140 extending from bottom surface 120 to top surface 110, and in the embodiment illustrated, back wall 140 includes rear opening 145 to hollow area 130, for example, to allow air to circulate through hollow area 130 and through top aperture 112 past computer 300, for instance.

In the example of support 100, body 605 includes, (e.g., is made of), foam, and article 100 includes fabric 610 covering at least a portion of body 605, as described herein. In some embodiments, fabric (e.g., 610) covers all of the foam (e.g., body 605), for instance, except where the foam (e.g., body 605) is covered with other components (e.g., liner 630). Further, in this embodiment, article 100 includes plastic liner 630, located within hollow area 130, plus end caps 620 and 650, which, alone or in combination, provide substantially increased stiffness to body 605. As used herein, in this context, providing substantially increased stiffness means reducing deflection by at least a factor of two, for at least one example of an external load applied to the article.

In the embodiment illustrated, article 100 has a front (e.g., where front wall 160 is located) and a back (e.g., where back wall 140 is located). In this embodiment, body 605 includes back wall 140 extending from bottom surface 120 to top surface 110 at the back of the article (e.g., where back wall 140 is shown in the drawings). Further, in the embodiment illustrated, body 605 includes and front wall 160 extending from bottom surface 120 to top surface 110 at the front of the article (e.g., where front wall 160 is shown in the drawings). In the embodiment illustrated, back wall 140 is taller than front wall 160, for example, so that top surface 110 is not parallel with bottom surface 120, or so that top surface 110 is not horizontal.

FIGS. 7 to 9 illustrate another embodiment of a laptop computer support, support 700. As shown in FIG. 9, support 700 includes top surface or portion 910, which may be made of plastic, and bottom surface or portion 920, which may be made of foam, for example. In some embodiments, bottom 920 may be coated in fabric (e.g., like fabric 610). In the embodiment illustrated, support 700 includes fan 111. Fan 111 may blow air from (or to) aperture 912 or between top 910 and bottom 920, in various embodiments. In the embodiment shown, aperture 912 extends downward through bottom 920 and draws air from (or blows air to) the lap area of the user, for example, that is then blown across back 320 of computer 300 (when computer 300 is sitting on support 700), for instance. In other embodiments, aperture 912 or bottom 920 include one or more passageways to the back, sides, or both, to draw or exhaust air to or from fan 111, for example. In the embodiment illustrated, top 910 includes recess or indentation 715 (e.g., similar to recess or indentation 115 described above) which may allow air from fan 111 to exhaust out (or be drawn from) the sides of support 700, for example.

Figure 10:
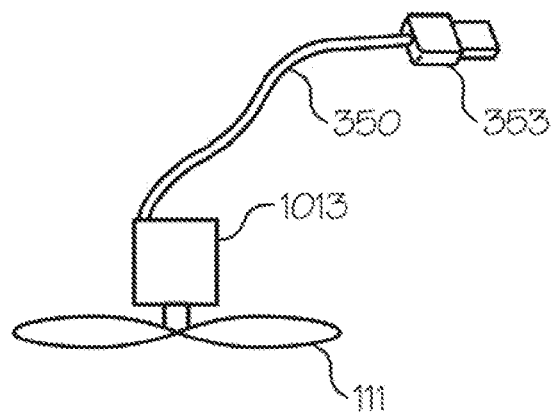
FIG. 10 is a detail side view of a fan, motor, cord, and plug that may be used in various embodiments of the invention.

FIG. 10 illustrates, as an example, fan 111, electric motor 1013, cord 350, and plug 353, which may be used in either the embodiment (e.g., support or article 100) illustrated in FIGS. 1-6 or the embodiment (e.g., support or article 700) illustrated in FIGS. 7-9. In the embodiment illustrated, fan 111 is an axial flow fan, and plug 353 is a USB plug, which may connect to a USB port in computer 300, for example.

In some embodiments, support 700 includes a storage area, for example, within bottom 920, for storing specific or various items. For example, in the embodiment illustrated, support 700 includes zipper pocket 845, which may be used, for instance, for storing USB cables, discs, a note pad, or the like. Further, in different embodiments, support 100, support 700, or the like, may include one or more of various electronic devices. Such supports may include, for example, a USB hub, a surge protector, power outlets, a battery charger, a power supply, an alarm, a motion sensor, a light, a mouse, trackball, or other pointer, one or more speakers, a docking port, a telephone, a remote control, a wireless router, a modem, a cable router, a disk drive, a DVD player (recorder, or both), memory, a cable retractor, a sensory stimulator (e.g., a device that produces vibrations, jerks, or the like, in conjunction or coordination with audiovisual stimuli), as examples.

Numerous embodiments of the invention are a support (e.g., 100 or 700) for a laptop computer (e.g., 300) that include a rigid structure (e.g., liner 630 or top 910) and a foam body (e.g., body 605 or bottom 920). Some such embodiments may include an aperture (e.g., 112 or 912), a recess or indentation (e.g., 115 or 715), or both (e.g., either alone or in combination). And some embodiments may include a fabric skin or covering (e.g., 610) surrounding some or all of the body (e.g., 605). In some embodiments, the structure is a core or liner (e.g., 630) for the support (e.g., 100), and the foam body (e.g., 605) surrounds the core or liner. In some embodiments, the core or liner (e.g., 630) includes or surrounds a hollow area (e.g., 130), for example. And in some embodiments that have a fabric skin (e.g., 610), end caps (e.g., 620 and 650) may snap into place to secure the fabric skin (e.g., 610).

Further, in some embodiments, the support (e.g., 100 or 700) includes a fan (e.g., 111). In certain embodiments, this fan (e.g., 111) may be positioned and configured, for example, to move air past a laptop computer (e.g., 300) that is sitting (e.g., as shown in FIGS. 3 and 4) on top of the support (e.g., 100 or 700). In certain embodiments, such a fan (e.g., 111) is configured to be powered by a USB port on the computer (e.g., on computer 300).

Other embodiments do not necessarily have such a structure (e.g., rigid structure and foam body), but rather are a support (e.g., 100 or 700) for a laptop computer (e.g., 300) that include such a fan (e.g., 111). Different embodiments may include a recess (e.g., 115 or 715). In some embodiments (in addition or instead), the body (e.g., 605) of the support (e.g., 100), the core or liner (e.g., 630), or both, is tubular, has substantially square ends (e.g., at the right side and the left side), has a cross section (e.g., when viewed from the right or left side) that is rectilinear, triangular, or trapezial, which may have rounded corners, has a cross section (e.g., when viewed from the front or back) that is rectilinear, trapezoidal, or an isosceles trapezoid, or a combination thereof. Some embodiments include an opening (e.g., 145) in the back (e.g., in wall 140). In other embodiments, other features described herein may distinguish the present invention from the prior art.

Among other things, FIGS. 1-9 illustrate at least two embodiments of articles (e.g., 100 and 700) for supporting computers (e.g., 300) that include a foam portion (e.g., body 605 or bottom 920), a plastic portion (e.g., 630, 620, 650, or a combination thereof, or 910) which provides substantially increased stiffness to the article (e.g., 100 or 700). These embodiments also include a top surface (e.g., 110 or 910), for example, for contacting the computer (e.g., 300) that has an indentation (e.g., 115 or 715), for example, to allow air to circulate by the computer (e.g., 300).

Both of these illustrated embodiments also include a bottom surface (e.g., 120 or 920), for example, for contacting the user's lap, (one) top aperture (e.g., 112 or 912) extending through the top surface (e.g., 110 or 910) to the indentation (e.g., 115 or 715), for instance, to allow airflow past the computer (e.g., 300), and fan 111, for example, positioned and configured to move air through the top aperture (e.g., 112 or 912) and past the computer (e.g., 300), for example. In various embodiments, the bottom surface (e.g., 120 or 920) may comprise or consist essentially of the foam or the foam portion (e.g., 605 or 920), as examples. And in some embodiments, the bottom surface (e.g., 120 or 920) may include the foam or foam portion (e.g., 605 or 920) covered with fabric (e.g., 610), as examples. Further, in different embodiments (e.g., article 100 or 700), the top surface may consist essentially of the plastic portion (e.g., 910), or the top surface (e.g., 110) may include the foam portion (e.g., 605) covered with fabric (e.g., 610), as further examples.

In various embodiments (e.g., 100 or 700) that have a fan (e.g., 111), the article (e.g., 100 or 700) may include an electric motor (e.g., 1013 shown in FIG. 10) connected to the fan (e.g., 111) and a USB cable (e.g., 350) electrically connected to the electric motor (e.g., 1013), for example. In some such embodiments, for example, the electric motor (e.g., 1013) may be configured to be powered through the USB cable (e.g., 350) when the USB cable (e.g., plug 353) is plugged into a USB port in the computer (e.g., 300), for instance. Further, in various embodiments that have an indentation (e.g., 115 or 715) in the top surface, the indentation (e.g., 115 or 715) may extend from the left side 150 to the right side 250 of the top surface (e.g., 110 or 910), for example.

Figure 11:
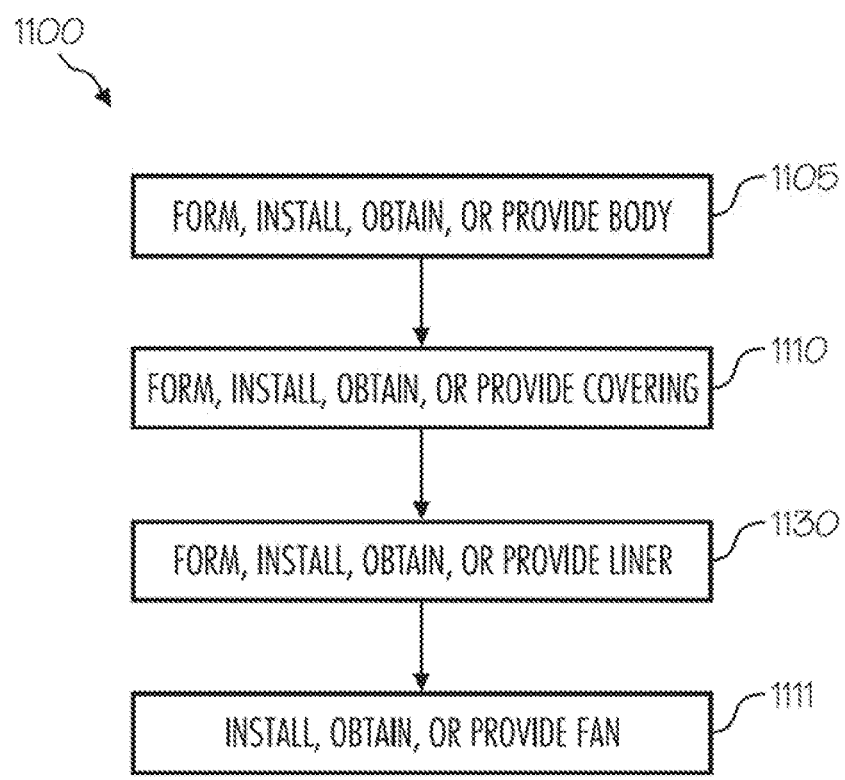
FIG. 11 is a flow chart that illustrates various embodiments of methods of manufacturing an article for supporting a computer in accordance with the invention.

Certain embodiments of the invention include processes or methods, wherein various articles, supports, or combinations of the elements described herein are manufactured, formed, obtained, provided, assembled, or a combination thereof, for example. For instance, method 1100 shown in FIG. 11 is an example of various methods of manufacturing (e.g., one or more) articles (e.g., 100) for supporting computers (e.g., 300) on users' laps, for example. Various methods may include specific acts, which may be performed in various orders, for example.

One such act, in method 1100, is act 1105 of forming, installing, obtaining, or providing a body, for example. Such a body may be a foam body (e.g., body 605 shown in FIG. 6) and may have a top surface (e.g., 110) for contacting the computer (e.g., 300) and a bottom surface (e.g., 120) for contacting the user's lap, for example. In some such embodiments, the body (e.g., 605) defines a hollow area (e.g., 130) between the top surface (e.g., 110) and the bottom surface (e.g., 120). Further, in some embodiments, the body (e.g., 605) includes at least one top aperture (e.g., 112) extending through the top surface (e.g., 110) to the hollow area (e.g., 130), for example, to allow airflow between the hollow area (e.g., 130) and the computer (e.g., 300). In particular embodiments, the body (e.g., 605) includes a side opening (e.g., 131, 132, or both)), a rear opening (e.g., 145), or a combination thereof, for instance, to allow air to circulate through the hollow area (e.g., 130) and through the top aperture (e.g., 112), for example.

Method 1100 further includes act 1110 of forming, installing obtaining, or providing a covering. Such a covering may be a fabric covering (e.g., 610), for example, which may cover at least a portion of the body (e.g., 605), for instance. In the embodiment illustrated, method 1100 also includes act 1130 of forming, installing, obtaining, or providing a liner. Such a liner may be a plastic liner (e.g., liner 630, end caps 620 or 650, or a combination thereof), which may be located within the hollow area (e.g., 130), and may provide substantially increased stiffness to the body (e.g., 605), for example. Further, in this embodiment, method 1100 further includes act 1111 of installing, obtaining, or providing a fan (e.g., 111). Such a fan (e.g., 111) may be positioned and configured to move air through the top aperture (e.g., 112) and past the computer (e.g., 300), for example.

Further still, in some embodiments, the act (e.g., 1111) of installing, obtaining, or providing the fan (e.g., 111) includes installing, obtaining, or providing an electric motor (e.g., 1013), for instance, connected to the fan (e.g., 111). Moreover, in some embodiments, the act (e.g., 1111) of installing, obtaining, or providing the fan (e.g., 111) includes installing, obtaining, or providing a USB cable (e.g., 350), which may be electrically connected to the electric motor (e.g., 1013) so that the electric motor (e.g., 1013) is configured to be powered through the USB cable (e.g., 350) when the USB cable (e.g., 350) is plugged into a USB port in the computer (e.g., 300), for example.

Even further, in some embodiments, act 1105 of forming, installing, obtaining, or providing the (e.g., foam) body (e.g., 605) includes forming, installing, obtaining, or providing a body (e.g., 605) having an indentation (e.g., 115) in the top surface (e.g., 110), for example, to allow air to circulate by the computer (e.g., 300). Furthermore, in a number of embodiments, act 1105 of forming, installing, obtaining, or providing the (e.g., foam) body (e.g., 605) includes forming, installing, obtaining, or providing a body (e.g., 605) having a first side opening (e.g., 131), for example, to allow air to circulate through the hollow area (e.g., 130) and through the top aperture (e.g., 112).

Moreover, in a number of embodiments, act 1105 of forming, installing, obtaining, or providing the (e.g., foam) body (e.g., 605) includes forming, installing, obtaining, or providing a body (e.g., 605) having a second side opening (e.g., 132), which may be opposite to the first side opening, for example, to allow air to circulate through the hollow area (e.g., 130), for instance. Furthermore, in some embodiments, act 1105 of forming, installing, obtaining, or providing the (e.g., foam) body includes forming, installing, obtaining, or providing a body (e.g., 605) having a rear opening (e.g., 145), for instance, to the hollow area (e.g., 130), for example, to allow air to circulate through the hollow area (e.g., 130) and through the top aperture (e.g., 112), as another example.

In various methods, supports (e.g., 100 and 700), features, or benefits described herein, or a combination thereof, may be advertised, displayed, sold, or a combination thereof, for instance, through retail establishments, through the Internet, or in locations where computers or computer peripheral devices (or both) are advertised or sold. Certain embodiments may include the laptop computer (e.g., 300), which may be sold separately, or together as part of a kit, for example. Other embodiments may be apparent to a person of ordinary skill in the art having studied this document, and may include features or limitations described herein, shown in the drawings, or both. Various embodiments of the invention include various combinations of the acts, structure, components, and features described herein or shown in the drawings. The invention also contemplates various means for accomplishing the various functions and acts described herein or apparent from the structure and acts described.

What is claimed is:

1. An article for supporting a computer on a user's lap and for isolating the user from heat from the computer, the article comprising:
    a tubular foam body covered with fabric;
    a top surface for contacting the computer;
    a bottom surface for contacting the user's lap;
    a back wall extending from the bottom surface to the top surface at a back of the article;
    a front wall extending from the bottom surface to the top surface at a front of the article;
    a center;
    a left side; and
    a right side;
    wherein:
        the back wall of the article is taller than the front wall of the article;
        the top surface of the article is at an acute angle to the bottom surface of the article;
        the foam body covered with the fabric has a first cross section, when viewed from a side, that is a trapezium with rounded corners;
        the front wall and the back wall are not vertical, but rather, lean in toward the center, so that the bottom surface has a greater horizontal dimension from front to back than the top surface;
        the left side and the right side lean in toward the center so that the bottom surface has a greater horizontal dimension from left to right than the top surface;

the foam body covered with the fabric has a second cross section, when viewed from the front or from the back that is a trapezoid;

the bottom surface comprises the foam body covered with the fabric:

the top surface comprises the foam body covered with the fabric;

the back wall comprises the foam body covered with the fabric;

the front wall comprises the foam body covered with the fabric;

the foam body covered with the fabric defines a hollow area between the top surface and the bottom surface and between the back wall and the front wall; and the foam body covered with the fabric further comprises a right side opening to the hollow area and a left side opening to the hollow area wherein the left side opening is opposite to the right side opening.

2. The article of claim 1 wherein the fabric is stitched to itself.

3. The article of claim 1 wherein the foam is closed-cell foam.

4. The article of claim 1 wherein the fabric is polyester.

5. The article of claim 1 wherein the fabric is woven.

6. The article of claim 1 wherein the fabric comprises sewn pockets.

7. The article of claim 1 wherein the foam has a thickness of about one inch to about 1¼ inch.

8. The article of claim 1 wherein the fabric covers all of the foam.

9. The article of claim 1 wherein the hollow area is a compartment for storage of the computer.

10. An article for supporting a computer on a user's lap and for isolating the user from heat from the computer, the article comprising:

a top surface for contacting the computer;

a bottom surface for contacting the user's lap;

a back surface extending from the bottom surface to the top surface; and a front surface extending from the bottom surface to the top surface;

wherein:

the back surface of the article is taller than the front surface of the article, the top surface of the article is at an acute angle to the bottom surface of the article;

the bottom surface has a greater horizontal dimension from the front surface to the back surface than the top surface;

the bottom surface has a greater horizontal dimension from left to right than the top surface;

the article has a first cross section, when viewed from a side, that is a trapezium with rounded corners;

the article has a second cross section, when viewed from the front or from the back that is a trapezoid;

the article comprises a tubular foam portion and fabric covering the tubular foam portion;

the bottom surface comprises the foam covered with the fabric;

the top surface comprises the foam covered with the fabric;

the back surface comprises the foam covered with the fabric;

the front surface comprises the foam covered with the fabric;

the article defines a hollow area between the top surface and the bottom surface and between the back surface and the front surface; and the article further comprises a right side opening to the hollow area and a left side opening to the hollow area.

11. The article of claim 10 wherein the fabric covers all of the foam portion.

12. The article of claim 11 wherein the left side opening is opposite to the right side opening.

13. An article for supporting a computer on a user's lap and for isolating the user from heat from the computer, the article having a front of the article and a back of the article, the article comprising:

a body comprising:

a top surface for contacting the computer;

a bottom surface for contacting the user's lap;

a back wall extending from the bottom surface to the top surface at the back of the article; and a front wall extending from the bottom surface to the top surface at the front of the article;

wherein:

the back of the article is taller than the front of the article, the top surface of the article is at an acute angle to the bottom surface of the article;

the bottom surface has a greater horizontal dimension from the front of the article to the back of the article than the top surface;

the body has a first cross section, when viewed from a side, that is a trapezium with rounded corners;

the bottom surface of the article has a greater horizontal dimension from left to right than the top surface of the article; and the body has a second cross section, when viewed from the front of the article or from the back of the article that is an isosceles trapezoid.

14. The article of claim 13 wherein the body is tubular and defines a hollow area between the top surface of the article and the bottom surface of the article and between the back of the article and the front of the article, and the body further comprises a right side opening to the hollow area and a left side opening to the hollow area wherein the left side opening is opposite to the right side opening.

15. The article of claim 13 wherein the body comprises a foam portion.

16. The article of claim 15 wherein the foam portion is tubular.

17. The article of claim 15 wherein the body comprises a fabric covering.

18. The article of claim 17 wherein the fabric covers the bottom surface of the article, the top surface of the article, the back of the article, and the front of the article.

* * * * *